United States Patent
Dede et al.

(10) Patent No.: US 9,584,061 B1
(45) Date of Patent: Feb. 28, 2017

(54) ELECTRIC DRIVE SYSTEMS INCLUDING SMOOTHING CAPACITOR COOLING DEVICES AND SYSTEMS

(71) Applicant: Toyota Motor Engineering & Manufacturing North America, Inc., Erlanger, KY (US)

(72) Inventors: Ercan Mehmet Dede, Ann Arbor, MI (US); Feng Zhou, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 14/857,147

(22) Filed: Sep. 17, 2015

(51) Int. Cl.
*H02P 29/00* (2016.01)
*H02M 1/32* (2007.01)
*H01L 35/30* (2006.01)

(52) U.S. Cl.
CPC .......... *H02P 29/0088* (2013.01); *H01L 35/30* (2013.01); *H02M 1/32* (2013.01)

(58) Field of Classification Search
CPC ....... H02P 29/0088; H01L 35/30; H02M 1/32
USPC ........ 318/139; 257/930, 706, 707, 717, 718, 257/720, 467, 40, 461; 361/162, 139, 361/169.1, 702, 679.47, 538, 699, 703, 361/704
See application file for complete search history.

(56) References Cited

U.S. PATENT DOCUMENTS

| | | | | |
|---|---|---|---|---|
| 5,414,488 A * | 5/1995 | Fujita | ................. | G03B 27/32 355/27 |
| 5,738,498 A * | 4/1998 | Allington | ........... | B01D 11/0203 210/175 |
| 6,308,519 B1 * | 10/2001 | Bielinski | ............... | F24F 5/0042 136/203 |
| 6,319,410 B1 * | 11/2001 | Allington | ........... | B01D 11/0203 210/511 |
| 7,751,191 B2 * | 7/2010 | Kakikawa | .......... | H05K 7/20563 257/930 |
| 7,800,194 B2 * | 9/2010 | Freedman | .............. | B82Y 30/00 257/461 |
| 7,812,443 B2 * | 10/2010 | Tokuyama | ............ | H01L 23/473 257/706 |
| 7,968,925 B2 * | 6/2011 | Tokuyama | ............ | H01L 23/473 257/299 |
| 8,355,244 B2 | 1/2013 | Kimura et al. | | |
| 8,519,505 B2 * | 8/2013 | Hiroshige | ................ | H01B 1/02 136/203 |
| 8,552,283 B2 | 10/2013 | Dede et al. | | |
| 8,669,635 B2 * | 3/2014 | Hiroshige | ................ | H01B 1/02 136/203 |
| 8,780,557 B2 | 7/2014 | Duppong et al. | | |

(Continued)

FOREIGN PATENT DOCUMENTS

| WO | WO2014120688 | 8/2014 |
|---|---|---|
| WO | WO2015059552 | 4/2015 |

*Primary Examiner* — Rita Leykin

(74) *Attorney, Agent, or Firm* — Dinsmore & Shohl LLP

(57) ABSTRACT

An electric drive system includes a smoothing capacitor including at least one terminal, a bus bar electrically coupled to the at least one terminal, a thermoelectric device including a first side and a second side positioned opposite the first side, where the first side is thermally coupled to at least one of the at least one terminal and the bus bar, and a cooling element thermally coupled to the second side of the thermoelectric device, where the cooling element dissipates heat from the thermoelectric device.

20 Claims, 7 Drawing Sheets

(56) References Cited

U.S. PATENT DOCUMENTS

| | | | | |
|---|---|---|---|---|
| 8,787,003 B2* | 7/2014 | Domes | ............... | H05K 7/1432 |
| | | | | 174/529 |
| 8,917,509 B2* | 12/2014 | Tokuyama | ............. | H01L 23/36 |
| | | | | 361/699 |
| 8,980,493 B2* | 3/2015 | Imamura | .......... | H01M 8/04029 |
| | | | | 429/433 |
| 9,018,807 B2* | 4/2015 | Ito | ........................ | H02M 7/003 |
| | | | | 310/64 |
| 9,065,322 B2* | 6/2015 | Ito | ......................... | H02K 5/225 |
| 9,179,581 B2* | 11/2015 | Suwa | ................... | H05K 7/2089 |
| 2009/0059637 A1* | 3/2009 | Sato | .................... | H05K 7/1432 |
| | | | | 363/147 |
| 2010/0132193 A1* | 6/2010 | Yoshinaga | ............ | H01L 25/072 |
| | | | | 29/874 |
| 2014/0313671 A1 | 10/2014 | Sugita et al. | | |

* cited by examiner

ELECTRIC DRIVE SYSTEMS INCLUDING SMOOTHING CAPACITOR COOLING DEVICES AND SYSTEMS

STATEMENT OF GOVERNMENT INTEREST

The subject matter of the present disclosure was developed with government support under Department of Energy Cooperative Agreement DE-EE0006429 awarded by the U.S. Department of Energy. Accordingly, the government has certain rights in the subject matter of the present disclosure.

TECHNICAL FIELD

The present specification generally relates to electric drive systems including cooling devices and cooling systems for smoothing capacitors and, more particularly, to cooling devices for smoothing capacitors including active cooling components.

BACKGROUND

Vehicles include various components that generate heat that must be dissipated to maintain the performance of the components. For example, hybrid-electric vehicles and electric vehicles include power electronics, such as inverters and/or inverter modules that generate a significant amount of heat. The inverters and/or inverter modules change DC power to AC power and provide the AC power to an electric motor, and may include smoothing capacitors that are electrically coupled to the inverter module. In some instances, a wide-band gap inverter may be utilized to change DC power to AC power, which may increase the amount of heat exposed to the smoothing capacitors.

Accordingly, a need exists for alternative cooling devices and cooling systems for smoothing capacitors.

SUMMARY

In one embodiment, an electric drive system includes a smoothing capacitor including at least one terminal, a bus bar electrically coupled to the at least one terminal, a thermoelectric device including a first side and a second side positioned opposite the first side, where the first side is thermally coupled to at least one of the at least one terminal and the bus bar, and a cooling element thermally coupled to the second side of the thermoelectric device, where the cooling element dissipates heat from the thermoelectric device.

In another embodiment, an electric drive system includes a battery, an electric motor electrically coupled to the battery, an inverter module electrically coupled to the battery and the electric motor, where the inverter module receives DC power from the battery and delivers AC power to the electric motor, a bus bar electrically coupled to the inverter module and the battery, a smoothing capacitor including at least one terminal electrically coupled to the bus bar, a thermoelectric device including a first side and a second side positioned opposite the first side, where the first side is thermally coupled to at least one of the at least one terminal and the bus bar, and a cooling element thermally coupled to the second side of the thermoelectric device, where the cooling element dissipates heat from the thermoelectric device.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Electric drive systems according to the present specification include a battery, an electric motor electrically coupled to the battery, and an inverter module electrically coupled to the battery and the electric motor. The electric drive systems may include a bus bar that electrically couples the inverter module and the battery, and a smoothing capacitor including at least one terminal electrically coupled to the bus bar. A thermoelectric device is thermally coupled to the terminal and/or the bus bar. By thermally coupling a thermoelectric device to the terminal and/or the bus bar, the thermoelectric device may be used to actively cool and maintain the terminal and the bus bar at an operational temperature. These and other embodiments will be described in more detail below in reference to the appended drawings.

The phrase "electrically coupled" is used herein to describe the interconnectivity of various components of the cooling system and means that the components are connected through wires or the like, such that electrical current may be exchanged between the components. The phrase "thermally coupled" is used herein to describe the interconnectivity of various components of the electric drive system and means that the components are coupled to one another such that thermal energy may be exchanged between the components. Components that are thermally coupled may be directly coupled or may be coupled via an intermediate, thermally conductive substrate layer (for example and without limitation, thermal paste, epoxy, direct bonded copper (DBC), direct bonded aluminum (DBA), or similar materials) and may be coupled by bonding techniques such as soldering, transient liquid phase bonding (TLP), or nano-silver sintering, for example. Alternatively, components that are thermally coupled may be detached from one another, but placed proximate to one another such that thermal energy may be exchanged between the components.

As used herein, the term "longitudinal direction" refers to the lengthwise direction of components of the electric drive system (i.e., in the +/−X-direction as depicted). The term "lateral direction" refers to the cross-component direction (i.e., in the +/−Y-direction as depicted), and is transverse to the longitudinal direction.

Figure 1:
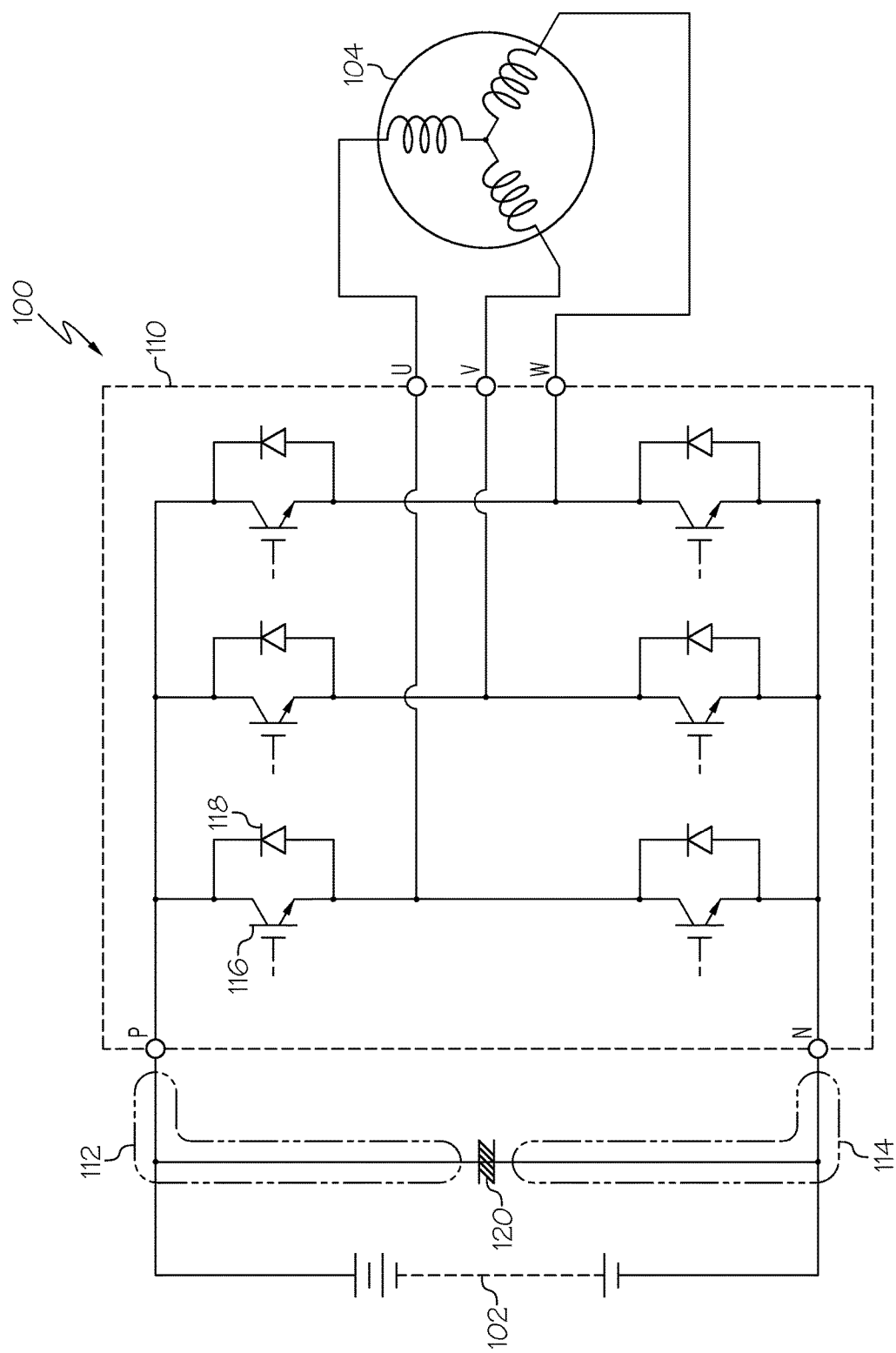
FIG. 1 schematically depicts a circuit diagram of an example electric drive system of a vehicle according to one or more embodiments shown and described herein.

Referring initially to FIG. 1, a circuit configuration diagram of one exemplary embodiment of an electric drive system 100 is schematically depicted. The electric drive system 100 includes a battery 102, a motor 104, and an inverter module 110 that are electrically coupled. The inverter module 110 receives DC power from the battery 102, converts the DC power to AC power, and provides the AC power to the motor 104. The motor 104 may include a three-phase motor that is part of a vehicle drivetrain, and may provide a driving force to a vehicle. The inverter module 110 includes an inverter element or inverter elements 116 (e.g., semiconductor devices such as MOSFETS, IGBTs, and the like), an inverter control circuit (not depicted), and may include a diode or diodes 118 that are electrically coupled in parallel with ones of the inverter elements 116. The electric drive system 100 includes at least one smoothing capacitor 120 that is electrically coupled to the battery 102 and the inverter module 110 by a first bus bar 112 and a second bus bar 114. The smoothing capacitor 120 may smooth the DC power provided by the battery 102 to the inverter module 110.

Figure 2:
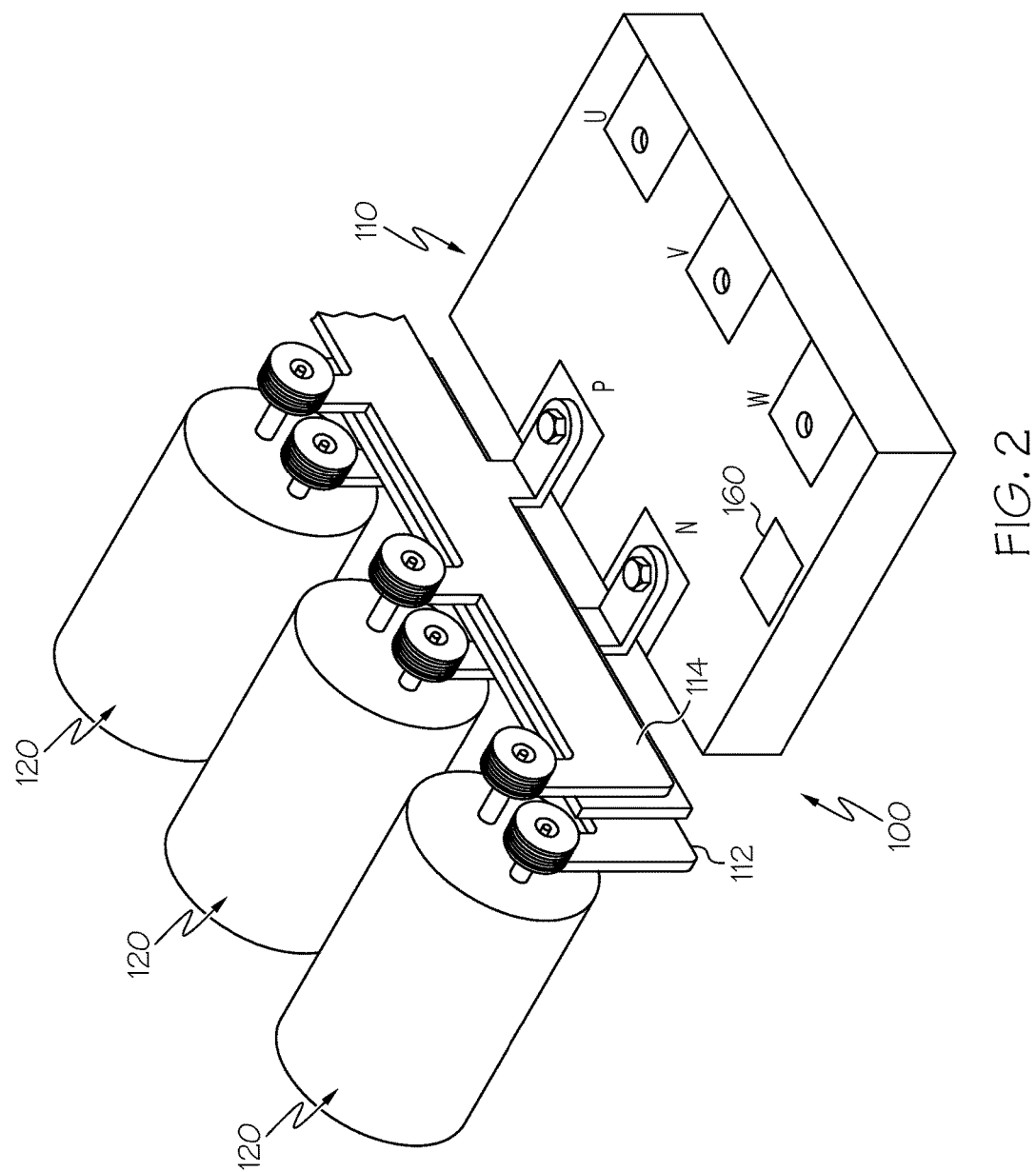
FIG. 2 schematically depicts a perspective view of example smoothing capacitors and an example inverter module of the electric drive system of FIG. 1 according to one or more embodiments shown and described herein.

Referring to FIG. 2, the smoothing capacitor or smoothing capacitors 120 are electrically coupled to the inverter module 110 through the first bus bar 112 and the second bus bar 114. In particular, the first bus bar 112 is electrically coupled to the smoothing capacitors 120 and to an N terminal of the inverter module 110 and the second bus bar 114 is electrically coupled to the smoothing capacitors 120 and to a P terminal of the inverter module 110. The inverter elements 116 (FIG. 1) and the diodes 118 (FIG. 1) may be positioned within the inverter module 110 and are electrically coupled to the smoothing capacitors 120 through the N terminal and the first bus bar 112, as well as the P terminal and the second bus bar 114. In the embodiment depicted in FIG. 2, the inverter module 110 includes a W terminal, a V terminal, and a U terminal at an output side of the inverter module 110. The W terminal, the V terminal, and the U terminal correspond to input terminals of the motor 104 (FIG. 1) and electrically couple the inverter module 110 to the motor 104.

Figure 3:
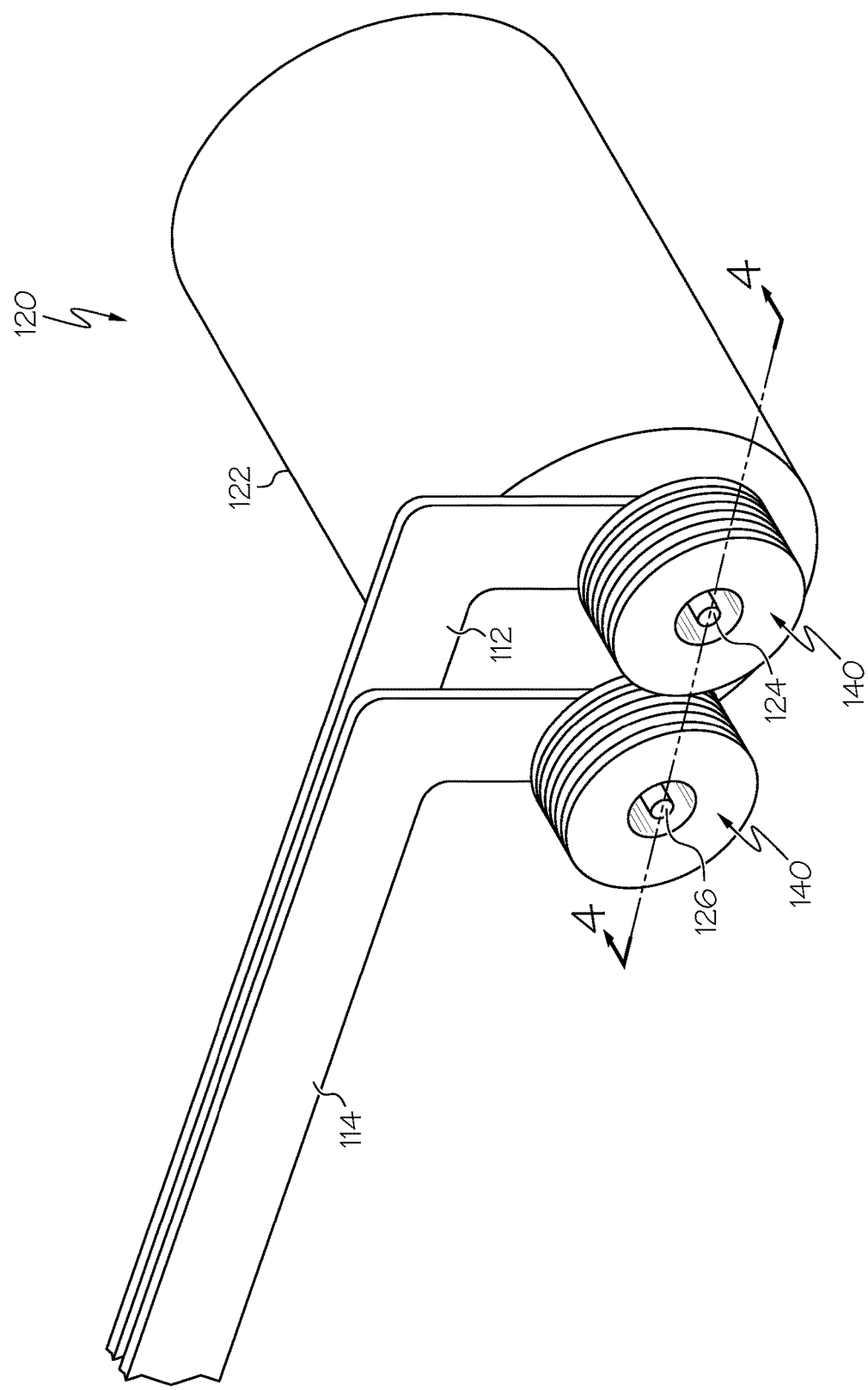
FIG. 3 schematically depicts an enlarged perspective view of one of the smoothing capacitors of FIG. 2 according to one or more embodiments shown and described herein.

Referring to FIG. 3, a perspective view of one of the smoothing capacitors 120 of FIG. 2 is depicted in isolation. The smoothing capacitor 120 includes a first terminal 124 and a second terminal 126 that extend outward from a body 122 of the smoothing capacitor 120. In the embodiment shown in FIG. 3, the first terminal 124 is coupled to the first bus bar 112, while the second terminal 126 is coupled to the second bus bar 114. The first terminal 124 and the second terminal 126 are also electrically coupled to the first bus bar 112 and the second bus bar 114, respectively, thereby electrically coupling the smoothing capacitor 120 to the battery 102 (FIG. 1). As described above, the first bus bar 112 and the second bus bar 114 are also electrically coupled to the N terminal and the P terminal of the inverter module 110 (FIG. 2), thereby electrically coupling the first terminal 124 and the second terminal 126 to the inverter module 110 (FIG. 2). As the battery 102 (FIG. 1) provides DC power to the inverter module 110 (FIG. 2), electrical current passes through the first bus bar 112 and the second bus bar 114. As electrical current is transferred between the first bus bar 112 and the first terminal 124 and between the second bus bar 114 and the second terminal 126, the electrical current generates heat at the connection between the first bus bar 112 and the first terminal 124 and at the connection between the second bus bar 114 and the second terminal 126. When the smoothing capacitor 120 of the electric drive system 100 is part of a vehicle drive train, significant electrical current may be transferred between the first bus bar 112 and the first terminal 124 and between the second bus bar 114 and the second terminal 126, thereby generating a significant amount of heat at the connection between the first bus bar 112 and the first terminal 124 and at the connection between the second bus bar 114 and the second terminal 126. Further, in embodiments where the inverter module 110 (FIG. 2) includes a wide-band gap inverter, such as a SiC, a GaN, or a diamond wide band-gap semiconductor inverter, a significant amount of heat may be generated at the first terminal 124 and the second terminal 126 and/or may be communicated from the inverter module 110 through the first bus bar 112 to the first terminal 124 and from the inverter module 110 through the second bus bar 114 to the second terminal 126.

Figure 4:
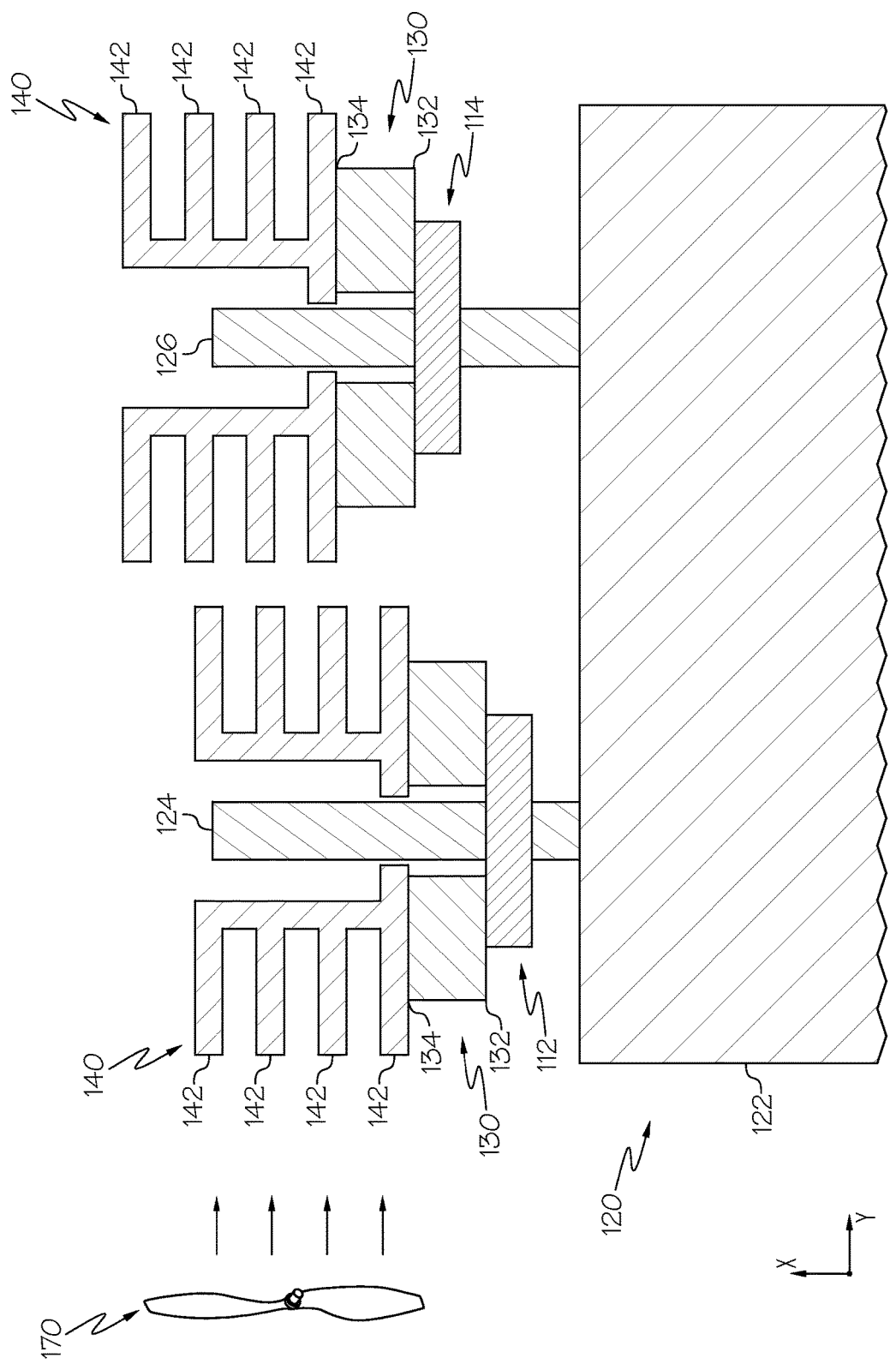
FIG. 4 schematically depicts a cross-section of the smoothing capacitor of FIG. 3 along section 4-4 according to one or more embodiments shown and described herein.

Referring to FIG. 4, a section view of the smoothing capacitor 120 is schematically depicted. In the embodiment shown in FIG. 4, a pair of thermoelectric devices 130 are thermally coupled to the smoothing capacitor 120. The thermoelectric devices 130 operate to cool the first terminal 124 and the second terminal 126 of the smoothing capacitor 120 during operation. One of the thermoelectric devices 130 is thermally coupled to the first terminal 124 of the smoothing capacitor 120 and another of the thermoelectric devices 130 is thermally coupled to the second terminal 126. The thermoelectric device 130 that is thermally coupled to the first terminal 124 is also thermally coupled to the first bus bar 112, and the thermoelectric device 130 that is thermally coupled to the second terminal 126 is also thermally coupled to the second bus bar 114. While the thermoelectric devices 130 are thermally coupled to the first terminal 124 and the second terminal 126 as well as the first bus bar 112 and the second bus bar 114, the thermoelectric devices 130 are electrically isolated from the first terminal 124, the second terminal 126, the first bus bar 112, and the second bus bar 114. Accordingly, electrical current passing through the first bus bar 112 and the second bus bar 114 and/or the first terminal 124 and the second terminal 126 is isolated from the thermoelectric devices 130. In the embodiment shown in FIG. 4, the thermoelectric devices 130 include an annular shape that is positioned around the first terminal 124 and the second terminal 126 of the smoothing capacitor 120. Alternatively, the thermoelectric devices 130 may include any suitable shape that may be thermally coupled to the first terminal 124 and the second terminal 126 and/or the first bus bar 112 and the second bus bar 114.

The thermoelectric devices 130 include any device that generates a temperature differential across the thermoelectric device 130 when an electric current is applied to the thermoelectric device 130, as a result of the Peltier effect. In embodiments, the thermoelectric devices 130 may be formed from Bismuth Antimony Telluride (BiSbTe). Alternatively, similar thermoelectric device materials may be used. Each of the thermoelectric devices 130 include a first side 132 and a second side 134 that is positioned opposite of the first side 132. In the embodiment depicted in FIG. 4, the first sides 132 are spaced apart from the second sides 134 of the thermoelectric devices 130 in the longitudinal direction. When an electrical current is applied to the thermoelectric devices 130, the current generates a temperature differential across the thermoelectric devices 130 and the electrical current may induce a relatively low temperature on the first side 132 of the thermoelectric devices 130, as compared to when electrical current is not applied to the thermoelectric devices 130. Additionally, when electrical current is applied to the thermoelectric devices 130, the current may induce a relatively high temperature on the second side 134 of the thermoelectric devices 130, as compared to when electrical current is not applied to the thermoelectric devices 130. Accordingly, when electrical current is applied to the thermoelectric devices 130, a temperature of the first side 132 is less than a temperature of the second side 134 of each of the thermoelectric devices 130.

In the embodiment depicted in FIG. 4, the first side 132 of one of the thermoelectric devices 130 is thermally coupled to the first terminal 124 and the first side 132 of another of the thermoelectric devices 130 is thermally coupled to the second terminal 126 of the smoothing capacitor 120. The first sides 132 of the thermoelectric devices 130 may also be thermally coupled to and/or mounted to the first bus bar 112 and the second bus bar 114. In particular, the first side 132 of one of the thermoelectric devices 130 may be thermally coupled and/or mounted to the first bus bar 112, and the first side 132 of another of the thermoelectric devices may be thermally coupled to and/or mounted to the second bus bar 114. By thermally coupling the first side 132 of the thermoelectric devices 130 to the first terminal 124, the second terminal 126, the first bus bar 112, and the second bus bar 114, the thermoelectric devices 130 may be cooled such that the first terminal 124, the second terminal 126 and/or the first bus bar 112, and the second bus bar 114 are maintained at an operational temperature.

In the embodiment depicted in FIG. 4, each of the thermoelectric devices 130 are thermally coupled a cooling element 140. In particular, the second side 134 of each of the thermoelectric devices 130 is thermally coupled to one of the cooling elements 140. In the embodiment depicted in FIG. 4, each of the cooling elements 140 include a heat sink including a plurality of fins 142 that extend radially around the cooling element 140 and that dissipate heat from the cooling element 140. In particular, the fins 142 facilitate the transfer of heat from the cooling element 140 to a medium surrounding the fins 142, such as ambient air. As the second sides 134 of the thermoelectric devices 130 are thermally coupled to the cooling element 140, heat from the second sides 134 of the thermoelectric devices 130 may be dissipated by the fins 142 of the cooling element 140.

In embodiments, the electric drive system 100 may further include a flow inducer 170 that induces fluid flow over the cooling elements 140. In the embodiment depicted in FIG. 4, the flow inducer 170 includes an axial fan that induces the medium surrounding the fins 142, such as ambient air, to flow over the fins 142. By inducing flow of the medium surrounding the fins 142, the flow inducer 170 may increase the amount of heat that may be dissipated by the fins 142 of the cooling element 140 as compared to when flow of the medium is not induced across the fins 142 of the cooling elements 140.

Figure 5:
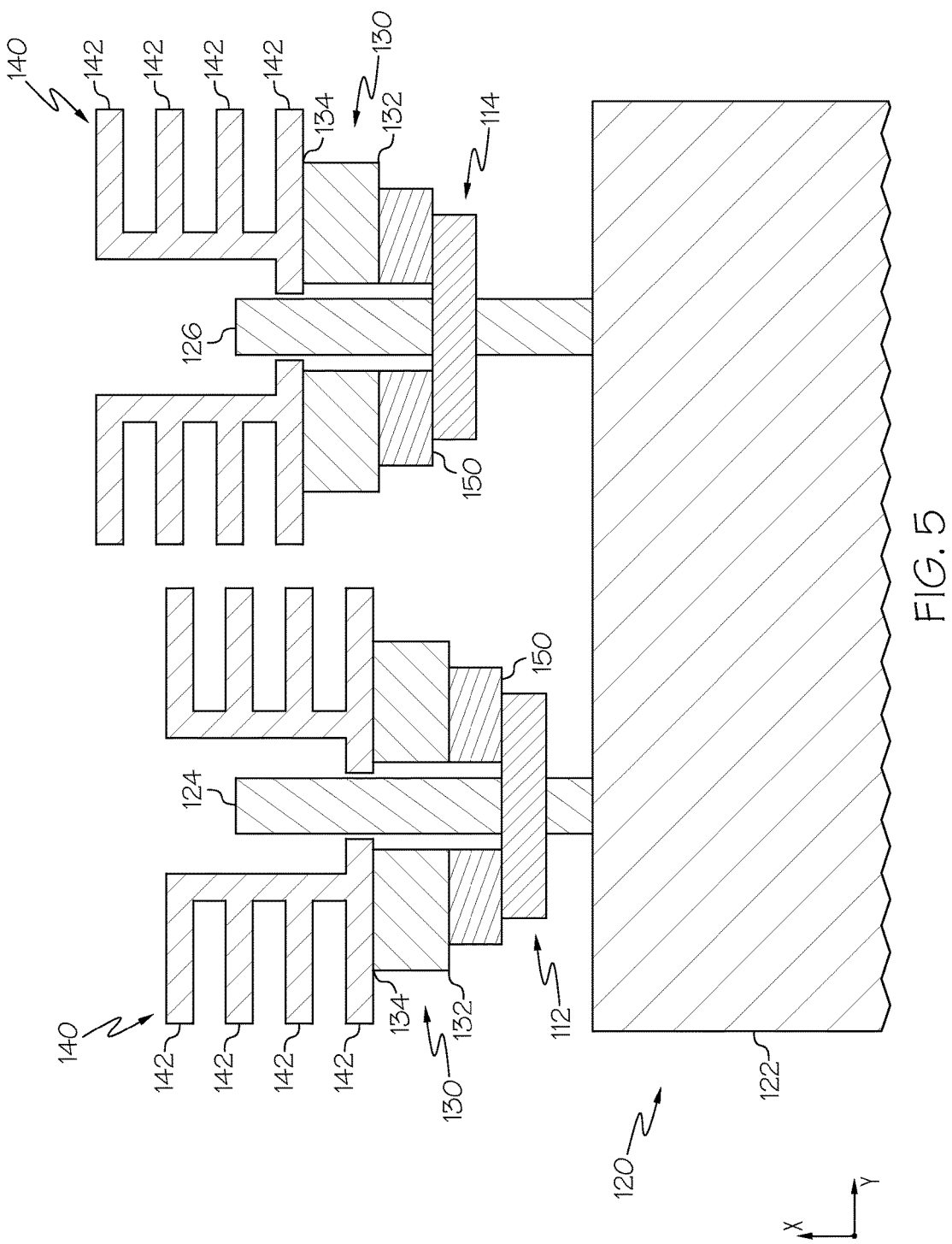
FIG. 5 schematically depicts a cross-section of another embodiment of an example smoothing capacitor according to one or more embodiments shown and described herein.

Referring to FIG. 5, in embodiments, a phase change component or phase-change components 150 are thermally coupled to the smoothing capacitor 120. In the embodiment depicted in FIG. 5, one phase-change component 150 is thermally coupled to the first bus bar 112 and/or the first terminal 124 of the smoothing capacitor, and another phase-change component 150 is thermally coupled to the second bus bar 114 and/or the second terminal 126. The phase-change components 150 may include an annular shape that is positioned around each of the first terminal 124 and the second terminal 126. Alternatively, the phase-change components 150 may include any suitable shape thermally coupled to the first terminal 124 and the first bus bar 112 and/or the second terminal 126 and the second bus bar 114. The phase-change components 150 may include a material that changes phase, for example between a solid state and a liquid state or between a liquid state and a gaseous state, when exposed to heat generated from the first terminal 124 and the first bus bar 112 and/or the second terminal 126 and the second bus bar 114. For example, in some embodiments, the phase-change components 150 may include and/or be formed from paraffin, a paraffin composite, or the like. When the phase-change components 150 change between phases, the phase-change components 150 absorb heat from the first terminal 124 and the second terminal 126 and/or the first bus bar 112 and the second bus bar 114. Accordingly, the phase-change components 150 may temporarily absorb heat from the first terminal 124 and the second terminal 126 and/or the first bus bar 112 and the second bus bar 114 while the phase-change components 150 change between phases. By temporarily absorbing heat, the phase-change components 150 may assist in maintaining the first terminal 124 and the second terminal 126 at an operational temperature when the electric drive system 100 is initially started, as will be described in greater detail herein.

Figure 6:
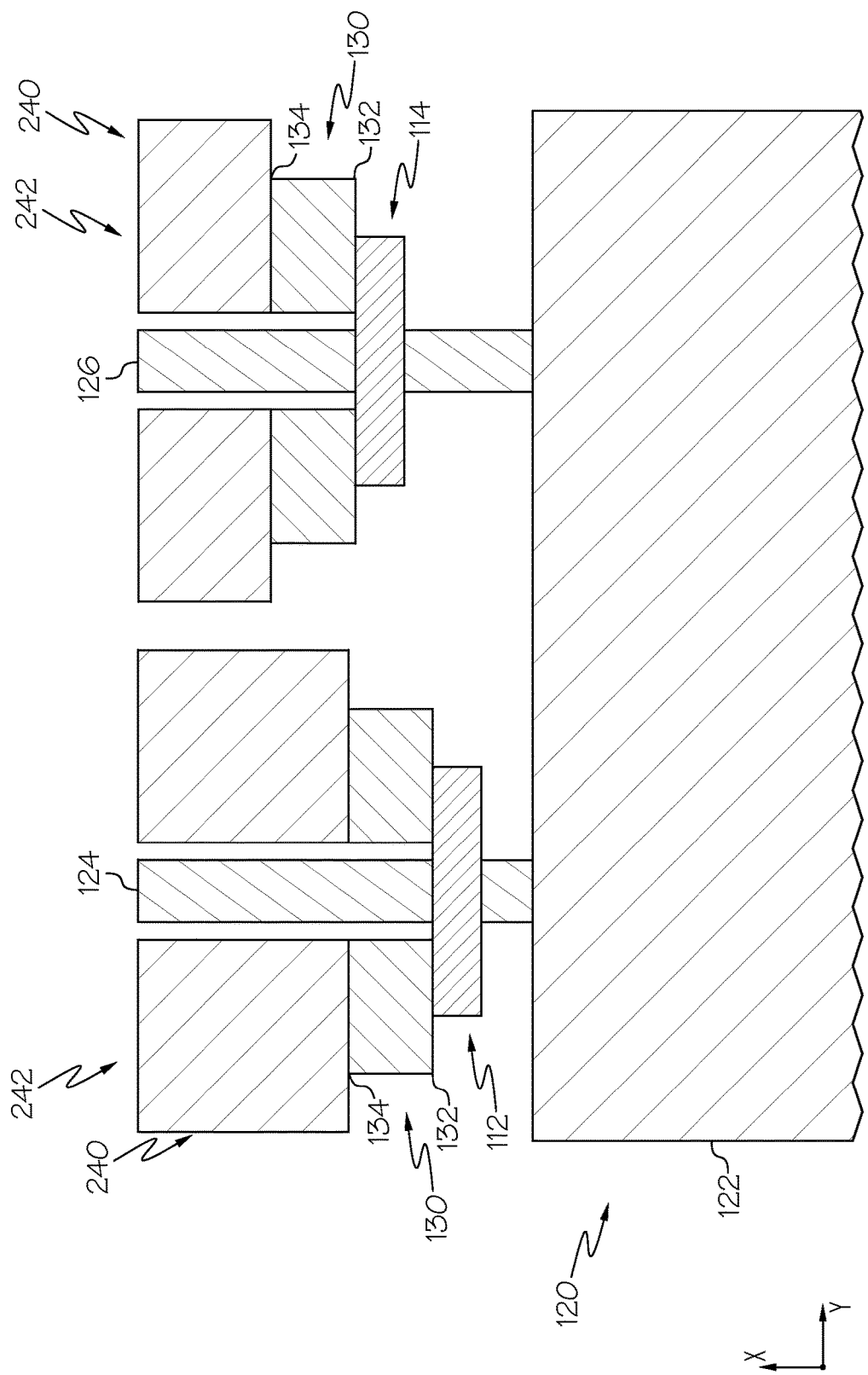
FIG. 6 schematically depicts a cross-section of another embodiment of an example smoothing capacitor according to one or more embodiments shown and described herein.

Referring to FIG. 6, a cross-section of the smoothing capacitor 120 with another embodiment of a cooling element or cooling elements 240 is depicted. Similar to the embodiment depicted in FIGS. 4 and 5, one of the thermoelectric devices 130 is thermally coupled to the first terminal 124 and the first bus bar 112, and another of the thermoelectric devices 130 is thermally coupled to the second terminal 126 and the second bus bar 114. However, in the embodiment depicted in FIG. 6, the cooling elements 240 include a cooling plate or cooling plates 242 thermally coupled to the second sides 134 of the thermoelectric devices 130. The cooling plates 242 may include a working fluid that absorbs heat from the second sides 134 of the thermoelectric devices 130 and in operation, the cooling plates 242 absorb heat from the second sides 134 of each of the thermoelectric devices 130. While in the embodiment depicted in FIG. 6, one cooling plate 242 is depicted as being thermally coupled to the second side 134 of one thermoelectric device 130, while another cooling plate 242 is schematically depicted as being thermally coupled to the second side 134 of another thermoelectric device 130, it should be understood that a single cooling plate 242 or multiple cooling plates 242 may be thermally coupled to the second sides 134 of the thermoelectric devices 130.

Figure 7:
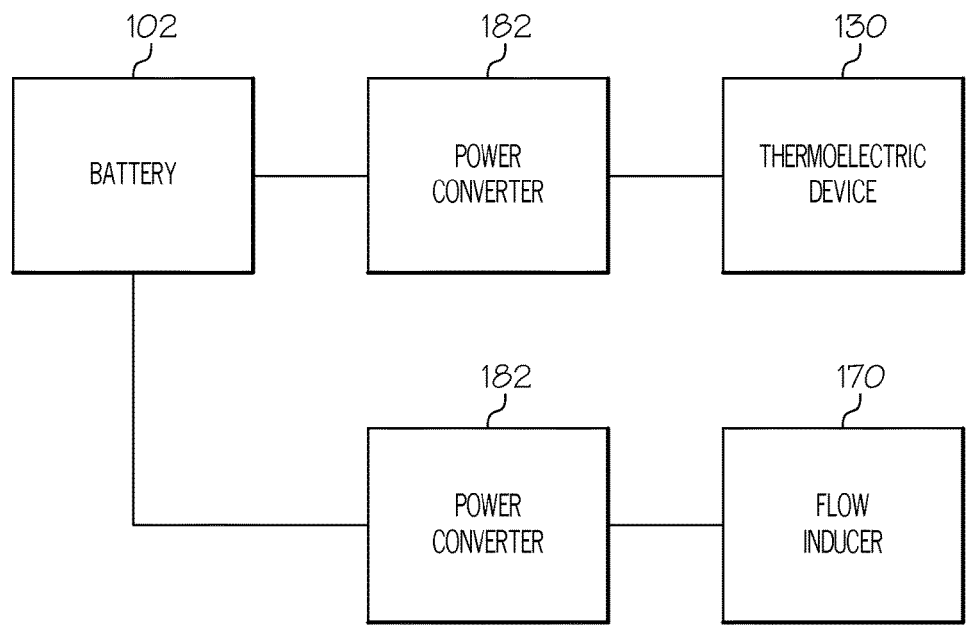
FIG. 7 schematically depicts a block diagram of the interconnectivity of components of an electric drive system according to one or more embodiments shown and described herein.

Referring to FIG. 7, a block diagram of the interconnectivity of components of the electric drive system 100 is schematically depicted. In the embodiment depicted in FIG. 7 the thermoelectric device or thermoelectric devices 130 are directly or indirectly electrically coupled to a power source, and in particular to the battery 102. In some embodiments, the thermoelectric devices 130 are indirectly electrically coupled to the battery 102 through a power converter 182, which may include a DC-DC converter. In operation, the battery 102 provides electrical current to the thermoelectric devices 130, thereby inducing a temperature differential across the thermoelectric devices 130. By inducing a temperature differential across the thermoelectric devices 130, the electrical current provided by the battery 102 induces the first sides 132 of the thermoelectric devices 130 to have a relatively low temperature, as compared to when electrical current is not applied to the thermoelectric devices 130. As described above, as the first sides 132 of the thermoelectric devices 130 are thermally coupled to the first terminal 124 and the first bus bar 112 as well as the second terminal 126 and the second bus bar 114, the first sides 132 of the thermoelectric devices may assist in cooling and maintaining the first terminal 124 and the second terminal 126 at an operational temperature. In embodiments where the inverter module 110 includes a wide-band gap semiconductor inverter, the inverter module 110 may operate at temperatures exceeding 150° C., and heat generated by the inverter module 110 may be communicated to the first bus bar 112, the second bus bar 114, the first terminal 124, and the second terminal 126. By cooling the first bus bar 112, the second bus bar 114, the first terminal 124, and the second terminal 126, the thermoelectric devices 130 may assist in maintaining the first terminal 124 and the second terminal 126 at an operational temperature, which, in some embodiments, may be lower than 85° C.

The battery 102 is also electrically coupled to the flow inducer 170, and may directly or indirectly provide electrical power to drive the flow inducer 170. In some embodiments, the battery 102 is indirectly electrically coupled to the flow inducer 170 through a power converter 182, which may include a DC-DC converter. As described above, the flow inducer 170 may induce flow of a medium over the fins 142 of the cooling element 140, which may increase the amount of heat that may be dissipated by the cooling elements 140. As the second sides 134 of the thermoelectric devices 130 are thermally coupled to the cooling elements 140, the flow inducer 170 may increase the amount of heat dissipated from the thermoelectric devices 130.

Figure 8:
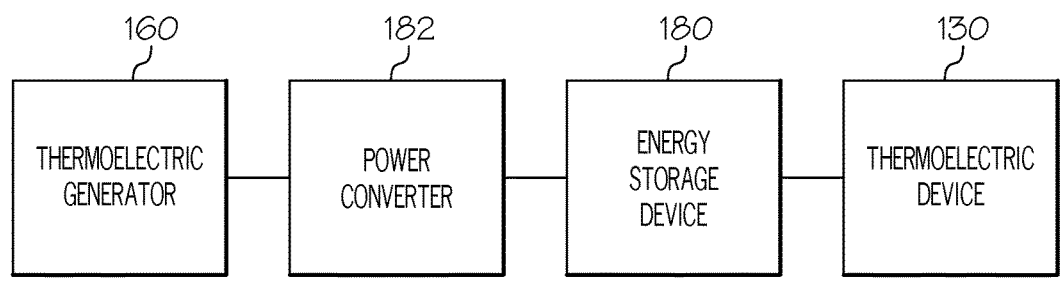
FIG. 8 schematically depicts a block diagram of the interconnectivity of components of an electric drive system according to one or more embodiments shown and described herein.

Referring collectively to FIGS. 2 and 8, in embodiments, the thermoelectric devices 130 are electrically coupled to a power source, and in particular, to a thermoelectric generator or thermoelectric generators 160. The thermoelectric generators 160 are thermally coupled to the inverter module 110, and in particular, one end of the thermoelectric generators 160 is thermally coupled to the inverter module 110. While the embodiment depicted in FIG. 2 shows a thermoelectric generator 160 thermally coupled to a housing of the inverter module 110, it should understood that the thermoelectric generators 160 may be thermally coupled to various components of the inverter module 110. For example, the thermoelectric generators 160 may be thermally coupled to a thermoelectric device terminal (not depicted) of the inverter module 110, as outlined in U.S. Pat. No. 8,552,283, which is assigned to the Toyota Motor Corporation, the entire contents of which are hereby incorporated by reference.

As described above, in operation, the inverter module 110 changes DC power provided by the battery 102 into AC power provided to the motor 104. As the inverter module 110 changes the DC power into AC power, components of the inverter module 110, such as the inverter elements 116, generate a significant amount of heat. While one end of the thermoelectric generators 160 are thermally coupled to the inverter module 110, an opposite end of the thermoelectric generators 160 is exposed to a medium, such as ambient air or an inverter cold plate (not shown). The medium is at a second temperature that is less than the temperature of the inverter module 110, thereby producing a temperature differential across the thermoelectric generators 160. The thermoelectric generators 160 generate a voltage potential when exposed to a temperature differential, and produce an electrical current when the voltage potential is electrically coupled to a load, as a result of the Seebeck effect. In embodiments, the thermoelectric generator 160 may be formed from Bismuth Antimony Telluride (BiSbTe). Alternatively, similar thermoelectric generator materials may be used.

Accordingly, by thermally coupling one end of the thermoelectric generators 160 to the inverter module 110, the heat generated by the inverter module 110 by changing DC electrical power to AC electrical power may be harvested by the thermoelectric generators 160 to produce an electrical current. In the embodiment depicted in FIG. 8, as the thermoelectric generators 160 are electrically coupled to the thermoelectric devices 130, the thermoelectric generators 160 may provide an electrical current to the thermoelectric devices 130. In some embodiments, the thermoelectric generators 160 may be electrically coupled to the thermoelectric devices 130 through a power converter 182, which may include a DC-DC converter, and/or an energy storage device 180, which may include an energy storage capacitor. By providing an electrical current to the thermoelectric devices 130, the thermoelectric generators 160 may induce the temperature differential in the thermoelectric devices 130, thereby cooling the first terminal 124, the second terminal 126, the first bus bar 112, and the second bus bar 114, as described above. In some embodiments, the thermoelectric generators 160 may alternatively or additionally be electrically coupled to the flow inducer 170, a pump for the cooling plates 242, or other powered components and/or sensors electrically coupled to the electric drive system 100.

Referring collectively to FIGS. 2, 5, and 8, when the electric drive system 100 is initially started, the inverter module 110 may be at a relatively low temperature as compared to when the inverter module 110 is in operation. As the inverter module 110 may be at a relatively low temperature, the temperature differential in the thermoelectric generators 160 may be relatively low as compared to when the electric drive system 100 is in operation. As the electrical potential and the electrical current generated by the thermoelectric generators 160 may be proportional to the temperature differential in the thermoelectric generators 160, the electrical current generated by the thermoelectric generators 160 may be relatively low when the electric drive system 100 is initially started.

Accordingly the electrical current provided to the thermoelectric devices 130 may be reduced when the electric drive system 100 is initially started. As the temperature differential induced in the thermoelectric devices 130 may be proportional to the amount of electrical current provided to the thermoelectric devices 130, the temperature differential in the thermoelectric devices 130, and accordingly the ability of the thermoelectric devices 130 to cool the first terminal 124, the second terminal 126, the first bus bar 112, and the second bus bar 114 may be reduced when the electric drive system 100 is initially started.

Referring to FIG. 5, the phase-change components 150 are thermally coupled to the first terminal 124 and the first bus bar 112 as well as the second terminal 126 and the second bus bar 114. As described above, the phase-change components 150 may temporarily absorb heat from the first terminal 124 and the first bus bar 112 as well as the second terminal 126 and the second bus bar 114. By temporarily absorbing heat from the first terminal 124 and the first bus bar 112 as well as the second terminal 126 and the second bus bar 114, the phase-change components 150 may assist in maintaining the first terminal 124, the first bus bar 112, the second terminal 126, and the second bus bar 114 at an operational temperature when the electric drive system 100 is initially started. Once the electric drive system 100 is in operation, heat generated by the inverter module 110 may be sufficient to generate electrical current using the thermoelectric generators 160 to induce a temperature differential in the thermoelectric devices 130 to cool and assist in maintaining the first terminal 124, the first bus bar 112, the second terminal 126, and the second bus bar 114 at an operational temperature.

It should now be understood that electric drive systems according to the present specification include a battery, an electric motor electrically coupled to the battery, and an inverter module electrically coupled to the battery and the electric motor. The electric drive systems may include a bus bar that electrically couples the inverter module and the battery, and a smoothing capacitor including at least one terminal electrically coupled to the bus bar. A thermoelectric device is thermally coupled to the terminal and/or the bus bar. By thermally coupling a thermoelectric device to the terminal and/or the bus bar, the thermoelectric device may be used to actively cool and maintain the terminal and the bus bar at an operational temperature. Further in some embodiments, a thermoelectric generator may be thermally coupled to the inverter module and electrically coupled to the thermoelectric device, such that heat generated by the inverter module may be used to power the thermoelectric device to cool the at least one terminal and/or the bus bar. In this way, heat that would otherwise be lost as waste heat may be harvested and utilized to power the thermoelectric device to actively cool and maintain the at least one terminal and/or the bus bar at an operational temperature.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An electric drive system comprising:
a smoothing capacitor comprising at least one terminal;
a bus bar electrically coupled to the at least one terminal;
a thermoelectric device comprising a first side and a second side positioned opposite the first side wherein the thermoelectric device is continuous between the first side and the second side, wherein the first side is thermally coupled to at least one of the at least one terminal and the bus bar, and wherein a temperature of the first side is less than a temperature of the second side of the thermoelectric device; and
a cooling element thermally coupled to the second side of the thermoelectric device, wherein the cooling element dissipates heat from the thermoelectric device.

2. The electric drive system of claim 1, further comprising a power source electrically coupled to the thermoelectric device.

3. The electric drive system of claim 2, wherein the power source applies an electrical current to the thermoelectric device.

4. The electric drive system of claim 2, wherein the power source comprises a battery.

5. The electric drive system of claim 2, wherein the power source comprises a thermoelectric generator.

6. The electric drive system of claim 5, further comprising an inverter module, wherein the thermoelectric generator is thermally coupled to the inverter module.

7. The electric drive system of claim 2, further comprising the thermoelectric device being indirectly electrically coupled to the power source through a power converter comprising a DC-DC converter.

8. The electric drive system of claim 1, further comprising a phase-change component thermally coupled to the at least one terminal.

9. The electric drive system of claim 1, further comprising a flow inducer that induces flow of a medium over the cooling element.

10. The electric drive system of claim 1, wherein the cooling element comprises a cooling plate thermally coupled to the second side of the thermoelectric device.

11. The electric drive system of claim 1, wherein the first side of the thermoelectric device is thermally coupled to the at least one terminal and the bus bar.

12. An electric drive system comprising:
a battery;
an electric motor electrically coupled to the battery;
an inverter module electrically coupled to the battery and the electric motor, wherein the inverter module receives DC power from the battery and delivers AC power to the electric motor;
a bus bar electrically coupled to the inverter module and the battery;
a smoothing capacitor comprising at least one terminal electrically coupled to the bus bar;
a thermoelectric device comprising a first side and a second side positioned opposite the first side, wherein the first side is thermally coupled to at least one of the at least one terminal and the bus bar, wherein the thermoelectric device is electrically isolated from the at least one terminal, and wherein a temperature of the first side is less than a temperature of the second side of the thermoelectric device; and
a cooling element thermally coupled to the second side of the thermoelectric device, wherein the cooling element dissipates heat from the thermoelectric device.

13. The electric drive system of claim 12, wherein the battery is electrically coupled to the thermoelectric device.

14. The electric drive system of claim 12, further comprising a thermoelectric generator electrically coupled to the thermoelectric device.

15. The electric drive system of claim 14, wherein the thermoelectric generator is thermally coupled to the inverter module.

16. The electric drive system of claim 12, wherein the cooling element comprises a plurality of fins that extends around the cooling element.

17. The electric drive system of claim 12, further comprising a flow inducer that induces flow of a medium over the cooling element.

18. The electric drive system of claim 12, wherein the cooling element comprises a cooling plate thermally coupled to the second side of the thermoelectric device.

19. The electric drive system of claim 12, wherein the first side of the thermoelectric device is thermally coupled to the at least one terminal and the bus bar.

20. The electric drive system of claim 12, further comprising a phase-change component thermally coupled to the at least one terminal.

* * * * *